US006359493B2

(12) United States Patent
Satomi

(10) Patent No.: US 6,359,493 B2
(45) Date of Patent: Mar. 19, 2002

(54) LEVEL SHIFT CIRCUIT

(75) Inventor: Katsuji Satomi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/738,712

(22) Filed: Dec. 15, 2000

Related U.S. Application Data

(63) Continuation of application No. 09/273,010, filed on Mar. 19, 1999.

(30) Foreign Application Priority Data

Mar. 20, 1998 (JP) .......................................... 10-072668

(51) Int. Cl.[7] .......................................... H03K 19/0185
(52) U.S. Cl. ...................... 327/333; 327/535; 327/589; 326/80
(58) Field of Search ................................. 327/333, 390, 327/391, 437, 534, 535, 536, 589, 590, 108; 326/80, 81, 82, 83, 88

(56) References Cited

U.S. PATENT DOCUMENTS

| | | | |
|---|---|---|---|
| 4,029,973 A | 6/1977 | Kobayashi et al. | ............. 326/88 |
| 4,080,539 A | 3/1978 | Steward | ......................... 326/81 |
| 4,656,373 A | 4/1987 | Plus | .............................. 326/81 |
| 5,399,915 A | * 3/1995 | Yahata | ........................ 327/108 |
| 5,440,263 A | 8/1995 | Fournel et al. | .............. 327/546 |
| 5,818,258 A | 10/1998 | Choi | ............................ 326/83 |
| 5,831,470 A | 11/1998 | Part et al. | .................... 327/536 |
| 5,894,230 A | 4/1999 | Voldman | ..................... 326/86 |
| 6,057,726 A | * 5/2000 | Sumida | ....................... 327/333 |

FOREIGN PATENT DOCUMENTS

JP 08181600 A 7/1996

* cited by examiner

*Primary Examiner*—Timothy P. Callahan
*Assistant Examiner*—An T. Luu
(74) *Attorney, Agent, or Firm*—Harness, Dickey & Pierce, P.L.C.

(57) ABSTRACT

In a level shift circuit, when a signal at a low voltage signal level applied at the signal input terminal changes from a LOW to a HIGH level, an inverter is boosted in input voltage level by a voltage booster on the basis of the voltage of a capacitor element charged through a diode element and on the basis of the input signal variation such that the inverter assumes an input voltage level above the aforesaid low voltage signal level. This enables the inverter to perform an inversion operation without fail and the signal output terminal provides a HIGH level signal at a high voltage. In addition, when the input signal changes from HIGH to LOW, an input of the inverter is pulled down directly by an N-channel transistor coupled to a ground power source to LOW. Accordingly, also in this case, the inverter performs an inversion operation without fail. The present level shift circuit is therefore able to operate with stability even when with respect to the high voltage power supply, the low voltage power supply has a voltage value lower than it has conventionally been assigned.

2 Claims, 14 Drawing Sheets

NORMAL OPERATION

MALFUNCTION

LEVEL SHIFT CIRCUIT

This application is a continuation of U.S. patent application Ser. No. 09/273,010, filed Mar. 19, 1999.

BACKGROUND OF THE INVENTION

The present invention relates to an improvement in level shift circuits for level shifting a low voltage signal to a high voltage signal to perform a signal transfer between two different circuits which are operated by different power supply voltages.

Recent increasing demand for low-power electronic devices has caused the power supply voltage of LSI internal circuits to decrease to 3 volts, to 2.5 volts or to less than 2.5 volts. This produces some necessities. For example, if an LSI external circuit is operated by 5 volts in contrast with the fact that the power supply voltage of a corresponding LSI internal circuit is 3 volts or less, this results in the requirement that an amplitude of 5 volts be provided. To this end, it is required to provide a level shift circuit capable of shifting either an amplitude of 3 volts, an amplitude of 2.5 volts or an amplitude of less than 2.5 volts to an amplitude of 5 volts.

Referring first to FIG. 10, there is shown an example of a conventional level shift circuit. Reference numeral 301 designates a signal input terminal. The signal input terminal 301 receives a low voltage (3 volts) signal from an inverter (an external circuit) 20 which is operated by low oltages (e.g., 3 volts). 302 designates an output signal terminal at which a high voltage (5 volts) signal is output to an operating circuit (not shown in the figure) which is operated by higher voltages (e.g., 5 volts).

Referring still to FIG. 10, 401 designates a first power supply terminal which is coupled to a low voltage power supply (e.g., a 3-V power supply). 402 designates a second power supply terminal which is coupled to a high voltage power supply (e.g., a 5-V power supply). 304 designates an N-channel MOS (Nch) transistor having (i) terminals of which one is coupled to the signal input terminal 301 and (ii) a gate which is coupled to the first power supply terminal 401. 303 designates an inverter made up of an Nch transistor 306 and a P-channel MOS (Pch) transistor 307. The inverter 303 receives its operating voltage from the second power supply terminal 402. The inverter 303 has an input coupled to the other of the terminals of the Nch transistor 304. Further, the inverter 303 has an output coupled to the output signal terminal 302. 305 designates a Pch transistor having terminals, namely a drain, a source, and a gate, wherein the drain terminal is coupled to the input of the inverter 303, the source terminal is coupled to the second power supply terminal 402, and the gate terminal is coupled to the output of the inverter 303. 403 designates an intermediate node between the Nch transistor 304 and the inverter 303.

Referring to FIG. 11(a), the operation of the level shift circuit of FIG. 10 will be described below.

Upon application of a signal which changes in voltage level from LOW (0 volt) to HIGH (3 volts) at the signal input terminal 301, the intermediate node 403 is pulled up to a voltage level (3−Vtn) through the Nch transistor 304 in the ON state, where Vtn represents the threshold voltage of the Nch transistor 304. If the switching voltage of the inverter 303, Vo. is set lower than the voltage (3−Vtn), this causes the output signal terminal 302 to decrease from HIGH (5 volts) towards LOW (0 volt) by signal inversion.

Because of a gate potential drop, the Pch transistor 305 goes into the ON state from the OFF state, and the intermediate node 403 is pulled up to HIGH (5 volts). Accordingly, the potential of the output signal terminal 302 is decreased to a lower value, finally arriving at LOW (0 volt). The Nch, transistor 304 comes to have a gate potential equal to or less than its source and drain potentials, as a result of which the Nch transistor 304 changes to the OFF state. Accordingly, there exists no current path extending from the high voltage power supply to the low voltage power supply, which makes it possible to perform a voltage level shifting operation in the steady state with direct currents cut off.

Next, upon application of a signal which changes in voltage level from HIGH (3 volts) to LOW (0 volt) at the signal input terminal 301, the gate potential of the Nch transistor 304 will relatively increase. The Nch transistor 304, therefore, changes to the ON state. The intermediate node 403 is decreased from HIGH (5 volts) towards LOW (0 volt). The Pch transistor 305 is in the ON state and the potential level of the intermediate node 403 is determined by the value of a sum of the ON resistance of the Nch transistor 304 and the ON resistance of the external circuit 20 which drives the signal input terminal 301 with respect to the ON resistance of the Pch transistor 305. That is, as the ON resistance of the Pch transistor 305 relatively increases, the potential level of the intermediate node 403 decreases. Accordingly, if the Pch transistor's ON resistance is set sufficiently greater than the aforesaid sum, this causes the intermediate node 403 to have a potential level below Vo (the inverter's 303 switching voltage) and signal conversion causes the output signal terminal 302 to increase from LOW (0 volt) towards HIGH (5 volts).

Because of such an operation, the Pch transistor 305 continues to be boosted in gate potential, and the ON resistance further increases. As a result, the potential of the intermediate node 403 is decreased to a lower value and the voltage of the output signal terminal increases. Finally, the Pch transistor 305 enters the OFF state and the intermediate node 403 arrives at LOW (0 volt) while the output signal terminal arrives at HIGH (5 volts). Also in this case, there exists no current path extending from the high voltage power supply to the low voltage power supply, which makes it possible to perform a voltage level shifting in the steady state with direct currents cut off.

Because of the foregoing operations, a signal of opposite phase to the input signal at the signal input terminal 301 appears at the output signal terminal 302. Such an inverted signal has an amplitude of 5 volts.

However, the above-described conventional level shift circuit has some drawbacks. One drawback is that both the possibility that the operating speed degrades and the possibility that the malfunction occurs increase when the low voltage power supply is decreased in voltage level to a further extent because of demands for lower power LSI circuits.

In the case the, signal input terminal 301 makes a change in voltage level from LOW to HIGH, a voltage level drop occurring in the low voltage power supply results in a speed drop which pulls up the potential of the intermediate node 403, for the drain current is reduced because both the drive performance of the external circuit 20 for driving the signal input terminal 301 and the gate voltage of the Nch transistor 304 in the ON state fall.

The reachable potential of the intermediate node 403 will fall for an amount approximately corresponding to a voltage level drop in the low voltage power supply. If such a reachable potential does not exceed Vo (the switching voltage of the inverter 303), no signal inversion is carried out, which causes the output signal terminal 302 to remain at HIGH. As a result, a malfunction occurs. Such a malfunction may be avoided by reducing the switching voltage. To this end, the gate width of the Nch transistor 306 forming a part of the inverter is required to be set relatively greater than that of the Pch transistor 307. However, the Pch transistor 307 is, of course, required to maintain some drive performance (gate width) and a reduction of the switching potential results in an abrupt increase in LSI pattern area. Therefore, such arrangement cannot be employed.

In addition to the above, if the gate width of the Nch transistor 306 is increased, this results in a gate capacitance load increase. This is a factor of degrading the operating speed.

A drop in the voltage level of the low voltage power supply occurring when the signal input terminal 301 changes in voltage level from HIGH to LOW results in a decrease in operating speed because both the drive performance of the external circuit 20 for driving the signal input terminal 301 and the drive performance of the Nch transistor 304 fall.

Additionally, with respect to the ON resistance of the Pch transistor 305, the foregoing sum increases, which makes it difficult to decrease the level of the intermediate node 403 to a lower value. Accordingly, in this case, it is required to establish a higher switching voltage level in order to ensure that the inverter 303 performs a signal inversion operation. Such a requirement conflicts with the case in which the signal input terminal 301 changes in voltage level from LOW to HIGH. This shows that a voltage level drop in the low voltage power supply results in a reduction in entire operating margin.

SUMMARY OF THE INVENTION

Accordingly, an object of the present invention is to provide an improved level shift circuit capable of performing a stable level shifting to shift a low voltage signal to a high voltage signal without the occurrence of degradation in operating speed even when with respect to the high voltage power supply voltage level, the low voltage power supply has a voltage level lower than it has conventionally been assigned.

In order to achieve the object, the present invention provides a level shift circuit which includes a voltage booster for boosting in voltage level an input of an output-stage inverter for converting a voltage level into another above a low power supply voltage level when a signal input terminal changes in voltage level from LOW to HIGH.

Additionally, the level shift circuit of the present invention includes either an Nch transistor for pulling the voltage level of the output-stage inverter input down to a lower value when the voltage level of the signal input terminal changes in voltage level from HIGH to LOW or a voltage booster for driving the Nch transistor.

The present invention provides a level shift circuit which comprises:
 (a) a level shift section, including (i) a signal input terminal at which a signal having a voltage level of a first power supply is input and (ii) an inverter which is operated by a second power supply having a voltage level above the first power supply voltage level and which inverts the input signal, for shifting a voltage level of the input signal to a voltage level of the second power supply, and
 (b) a first voltage booster which is operated by the input signal and by the first power supply and which generates, in accordance with timing of a transition of the input signal from a LOW to a HIGH level, a signal having a voltage level above the first power supply voltage level and outputs the thus generated signal to the inverter.

The present invention provides a level shift circuit which comprises:
 (a) a level shift section, including (i) a signal input terminal at which a signal having a voltage level of a first power supply is input and (ii) a cross latch circuit which is operated by a second power supply having a voltage level above the first power supply voltage level and which receives a signal in phase with the input signal and a negative phase signal with the input signal, for shifting a voltage level of the input signal to a voltage level of the second power supply, and
 (b) a first voltage booster which is operated by the input signal and by the first power supply and which generates, in accordance with timing of a transition of the input signal from a LOW to a HIGH level, a signal having a voltage level above the first power supply voltage level and outputs the thus generated signal to the cross latch circuit.

The present invention provides a level shift circuit which comprises:
 (a) a level shift section, including (i) a signal input terminal at which a signal having a voltage level of a first power supply is input and (ii) an inverter which is coupled to a second power supply having a voltage level above the first power supply voltage level and which inverts the input signal, for shifting a voltage level shifting of the input signal to a voltage level the second power supply, and
 (b) a first voltage booster which is operated by the input signal and by the first power supply and which generates, in accordance with timing of a transition of the input signal from a LOW to a HIGH level, a signal having a voltage level above the first power supply voltage level and outputs the thus generated signal to the inverter,
 the level shift section further including a first N-channel MOS transistor having (i) terminals of which one is coupled to a ground power supply and the other is coupled to an input of the inverter and (ii) a gate at which a negative phase signal with the input signal is input.

In the above-described level shift circuit in accordance with the present invention, the first voltage booster further includes a pump circuit for boosting the generated signal to a higher voltage level.

In the above-described level shift circuit in accordance with the present invention, (a) a third N-channel MOS transistor is provided having (i) terminals of which one is coupled to a ground power supply and (ii) a gate which is coupled to the signal input terminal, (b) the gate of the first N-channel MOS transistor in the level shift section is not fed a negative phase signal but is coupled to the other of the terminals of the third N-channel MOS transistor, (c) a second voltage booster is provided having an output which is coupled to the gate of the first N-channel MOS transistor, and (d) the second voltage booster is operated by the input signal and by the first power supply and generates, in accordance with timing of a transition of the input signal from a HIGH to a LOW level, a signal having a voltage level above the first power supply voltage level and outputs the thus generated signal to the gate of the first N-channel MOS transistor.

In the above-described level shift circuit in accordance with the present invention, the second voltage booster further includes a pump circuit for boosting the generated signal to a higher voltage level.

In the above-described level shift circuit in accordance with the present invention, (a) the pump circuit is provided plurally in number and (b) these pump circuits are connected in series so that the generated signal is boosted in voltage level plural times.

The present invention provides the following advantages. In accordance with the present invention, even for the case of a signal which is input at the signal input terminal and which has a low-degree HIGH level (e.g., 2 volts) not as high as one that has conventionally been applied, such a low-degree HIGH level signal, when input, is boosted in voltage level by the first voltage booster, therefore enabling the boosted voltage level to exceed the switching level of the inverter of the level shift section and that of the cross latch circuit. Accordingly, when the voltage level boosted signal is input to the inverter of the level shift section or to the cross latch circuit, the inverter or the cross latch circuit, whichever has been fed the signal, will perform a HIGH-to-LOW inversion operation without fail to secure a desired operation.

Particularly, in the present invention, at the time when a signal that is applied at the signal input terminal makes a transition to HIGH, a voltage level boosted by the first voltage booster is further increased by the pump circuit, which makes it possible for an input signal to the inverter of the level shift section to assume a voltage level above the switching level of the inverter even when the signal applied at the signal input terminal has a low-degree HIGH level.

In the present invention, the provision of the plural pump circuits can ensure that the voltage level of a signal that is input to the inverter of the level shift section is increased above the switching level of the inverter, therefore providing a greater operation margin to the level shift circuit.

In the present invention, when a signal at LOW is input from the signal input terminal, the first Nch transistor enters the ON state upon receipt of a negative phase signal with that LOW input signal, thereby coupling the input of the inverter to a ground power supply. Accordingly, the potential of the inverter decreases in LOW direction. Here, the pulling down of the inverter input to LOW is performed without involving any external circuit. In other words, such a pulling down operation is unaffected by the ON resistance of an external circuit for driving the signal input terminal, and the voltage level of the inverter input can be decreased to a lower value in comparison with conventional level shift circuits. Accordingly, even when the voltage level of the first power supply is lower than conventionally-used ones, it can be ensured that the inverter performs a LOW-to-HIGH signal inversion operation.

In the present invention, when a signal at LOW is input at the signal input terminal, the third Nch transistor enters the OFF state and the gate potential of the first Nch transistor is increased above at least the first power supply voltage level by the second voltage booster. Since the ON resistance of the first Nch transistor diminishes, the input of the inverter in the level shift section is coupled, through such a diminished ON resistance, to a ground power supply. As a result, the potential of the inverter input is decreased to a further extent. This can further ensure that the inverter performs a LOW-to-HIGH signal inversion operation at a high speed.

In the present invention, a voltage boosted in the second voltage booster is boosted to a higher value by the pump circuit, which makes it possible to decrease the ON resistance of the first Nch transistor to a further extent. This can further ensure that the inverter performs a LOW-to-HIGH signal inversion operation at a high speed.

In the present invention, the second voltage booster is provided with a plurality of pump circuits, which can ensure that the inverter performs a signal inversion operation at a high speed.

DETAILED DESCRIPTION OF THE INVENTION

Preferred embodiments of the present invention will be described below by reference to the attached drawings.

First Embodiment

Figure 1:
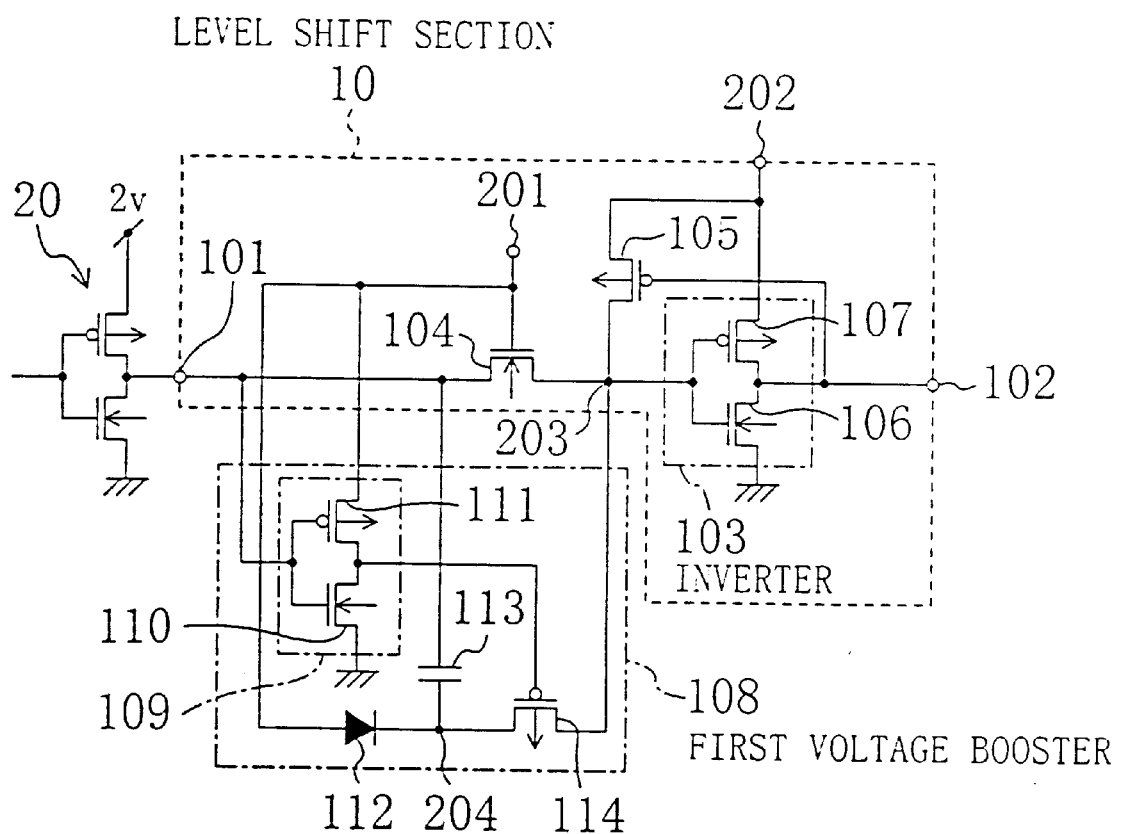
FIG. 1 is a circuit diagram showing a structure of a level shift circuit in accordance with a first embodiment of the present invention.

Referring first to FIG. 1, there is shown a level shift circuit in accordance with a first embodiment of the present invention. In FIG. 1, reference numeral 101 designates a signal input terminal. The signal input terminal 101 receives a low voltage (2 volts) signal from an inverter 20 (an external circuit) which is operated by low voltages (e.g., 2 volts). 102 designates an output signal terminal. The output signal terminal 102 outputs a high voltage (5 volts) signal to an operating circuit (not shown in the figure) which is operated by high voltages (e.g., 5 volts).

201 designates a first power supply terminal coupled to a low voltage (e.g., 2 volts) power supply (a first power supply) which is not shown in the figure. 202 designates a second power supply terminal coupled to a high voltage (e.g., 5 volts) power supply (a second power supply) which is not shown in the figure. 104 designates an NchMOS transistor (a first NchMOS transistor). The NchMOS transistor 104 has terminals of which one is coupled to the signal input terminal 101, and a gate which is coupled to the first power supply terminal 201. 103 designates an inverter. The inverter 103 is made up of an Nch transistor 106 and a Pch transistor 107 and the operating voltage thereof is supplied from the second power supply terminal 202. The inverter 103 has an input and an output, the former being coupled to the other terminal of the Nch transistor 104 and the latter being coupled to the output signal terminal 102. 105 designates a PchMOS transistor (a first PchMOS transistor) having a drain, a source, and a gate, wherein the drain is coupled to the input of the inverter 103, the source is coupled to the second power supply terminal 202, and the gate is coupled to the output of the inverter 103. 203 designates an intermediate node between the Nch transistor 104 and the inverter 103.

As described above, a level shift circuit 10 for performing a voltage level shifting of a signal, input at the signal input terminal 101, from a voltage level (2 volts) to another (i.e., the second power supply voltage level (5 volts)) is constructed.

Referring still to FIG. 1, there is shown a voltage booster 108 (a first voltage booster). The voltage booster 108 is constructed as follows. The voltage booster 108 has an inverter 109 made up of an Nch transistor 110 and a Pch transistor 111 and the operating voltage thereof is supplied from the first power supply terminal 201. The voltage booster 108 has an input coupled to the signal input terminal 101. 112 is a diode functional element (a first diode functional element). A positive electrode node of the diode functional element 112 is coupled to the first power supply terminal 201. The diode functional element 112 is configurable by a transistor, which will be the same as in the following description. 113 is a capacitor functional element (a first capacitor functional element). The capacitor functional element 113 is connected between the signal input terminal 101 and a negative electrode node of the diode functional element 112. Reference numeral 204 designates an intermediate node between the diode functional element 112 and the capacitor functional element 113. 114 designates a PchMOS transistor (a second PchMOS transistor). The PchMOS transistor 114 is connected between the intermediate node 204 and the intermediate node 203 and has a gate coupled to an output of the inverter 109.

Figure 2:
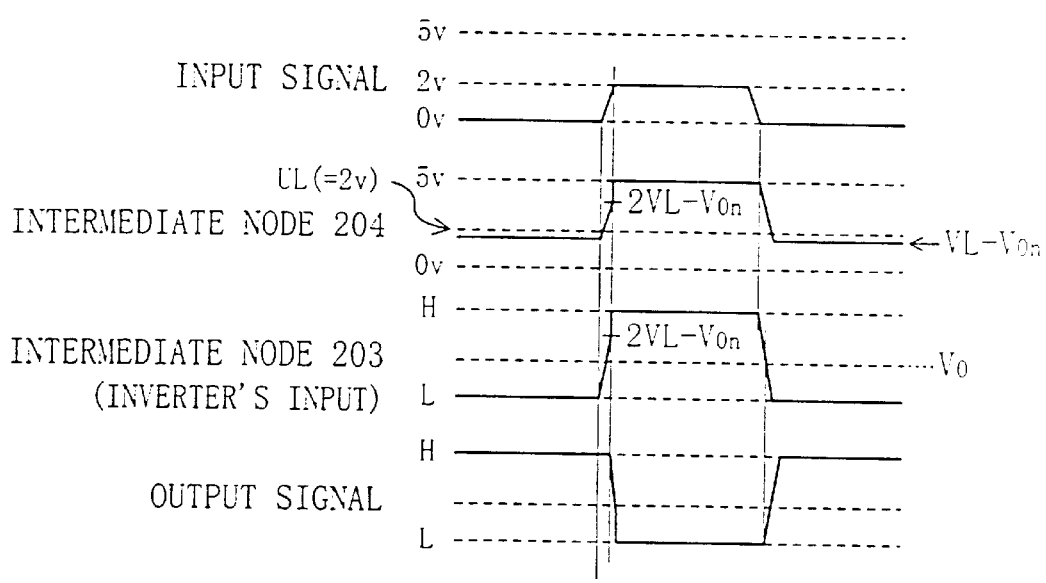
FIG. 2 is a timing chart diagram useful in understanding the operation of the first embodiment.

Referring now to FIG. 2, the operation of the above-describe level shift circuit will be described below.

Firstly, a situation, in which a low level voltage (0 volt) is applied at the signal input terminal, is explained as an initial state. In this situation, the voltage of the intermediate node 203 is made LOW through the Nch transistor 104 and the inverter 103 outputs, at the output signal terminal 102, a HIGH level voltage (5 volts) which is the second power supply voltage level. The Pch transistor 105 is in the OFF state, for its gate is HIGH.

One of terminals of the capacitor functional element 113 is LOW. The capacitor functional element 113 has been charged, through the diode functional element 112, to a level lower than the first power supply voltage level by a degree corresponding to a drop in the ON voltage of the diode functional element 112. The voltage which is charged to the capacitor functional element 113, Vcl, is given by:

Vcl=VL−Von, where VL is the voltage of the first power supply and Von is the ON voltage of the diode functional element 112. The Pch transistor 114 is in the OFF state, for its gate is made HIGH (2 volts) by the inverter 109 (in other words, the gate is made as high as the first power supply voltage level).

When the signal input terminal 101 makes a change in voltage level to HIGH, the capacitor functional element 113 is pulled up in potential for the voltage VL. The intermediate node 204 is also pulled up in potential for the voltage VL. As a result, the diode functional element 112 turns off. At this time, the intermediate node 204 has a potential (i.e., a voltage (2VL−Von) obtained by summing together a voltage charged to the capacitor functional element 113 and the voltage VL). At the same time, the Pch transistor 114 enters the ON state because the inverter 109 gives its output at LOW, wherein the potential of the intermediate node 204 is communicated to the intermediate node 203. If the capacitance of the capacitor functional element 113 is set above the intermediate node's 203 parasitic capacitance, this makes it possible for the intermediate node 203 to assume a potential level of approximately (2VL−Von).

When the potential of the intermediate node 203 is pulled up to exceed the switching voltage (Vo) of the inverter 103, the output signal terminal 102 starts shifting to LOW by inversion. Because of such inversion, the Pch transistor 105 enters the ON state, thereby pulling up the voltage level of the intermediate node 203 to that of the second power supply. The voltage of the output signal terminal 103 arrives at LOW. At the same time, the Nch transistor 103, since its gate potential is equal to or less than that of the source and drain, changes to the OFF state. Accordingly, there exists no current path from the second voltage power supply to the first voltage power supply, which makes it possible to perform a voltage level shifting operation in the steady state with direct currents cut off.

In a prior art level shift circuit, the intermediate node voltage is pulled up to a voltage level of (VL−Vtn), while in accordance with the present invention, the intermediate node voltage is pulled up to a voltage level of (2VL−Von). The MOS transistor threshold voltage varies depending on the fabrication process. Suppose here that Vtn=0.5 V, that it remains unchanged in defiance of increments by the substrate bias effect, and that the inverter switching voltage is 2.3 volts. In a conventional level shift circuit, VL=2.8 V is an operating limit voltage. On the other hand, in the present level shift circuit, the diode ON voltage (Von) is some 0.7 volt and the operation is possible up to VL=1.5 V.

When the signal input terminal 101 changes in voltage level from HIGH to LOW, the Nch transistor 104 changes to the ON state, and the potential of the intermediate node 203 falls from HIGH (5 bolts) (i.e., the second power supply voltage level) towards LOW (0 volt). The gate potential of the Pch transistor 114 has been made HIGH (2 volts) by the inverter's 109 output and the Pch transistor 114 enters the OFF state because the intermediate node 203 is decreased in potential. As a result, the inside of the voltage booster 108 returns to the initial state. When the potential of the intermediate node 203 is pulled below the switching voltage (Vo) of the inverter 103, a high level (5 volts) voltage is applied to the output signal terminal 102 by signal inversion and the Pch transistor 105 enters the OFF state.

As a result of the above-described operations, a signal of opposite phase to the input signal applied at the signal input terminal 101 appears at the output signal terminal 102, having an amplitude of 5 volts.

Second Embodiment

A second embodiment of the present invention will be described by making reference to a level shift circuit shown in FIG. 3.

Figure 3:
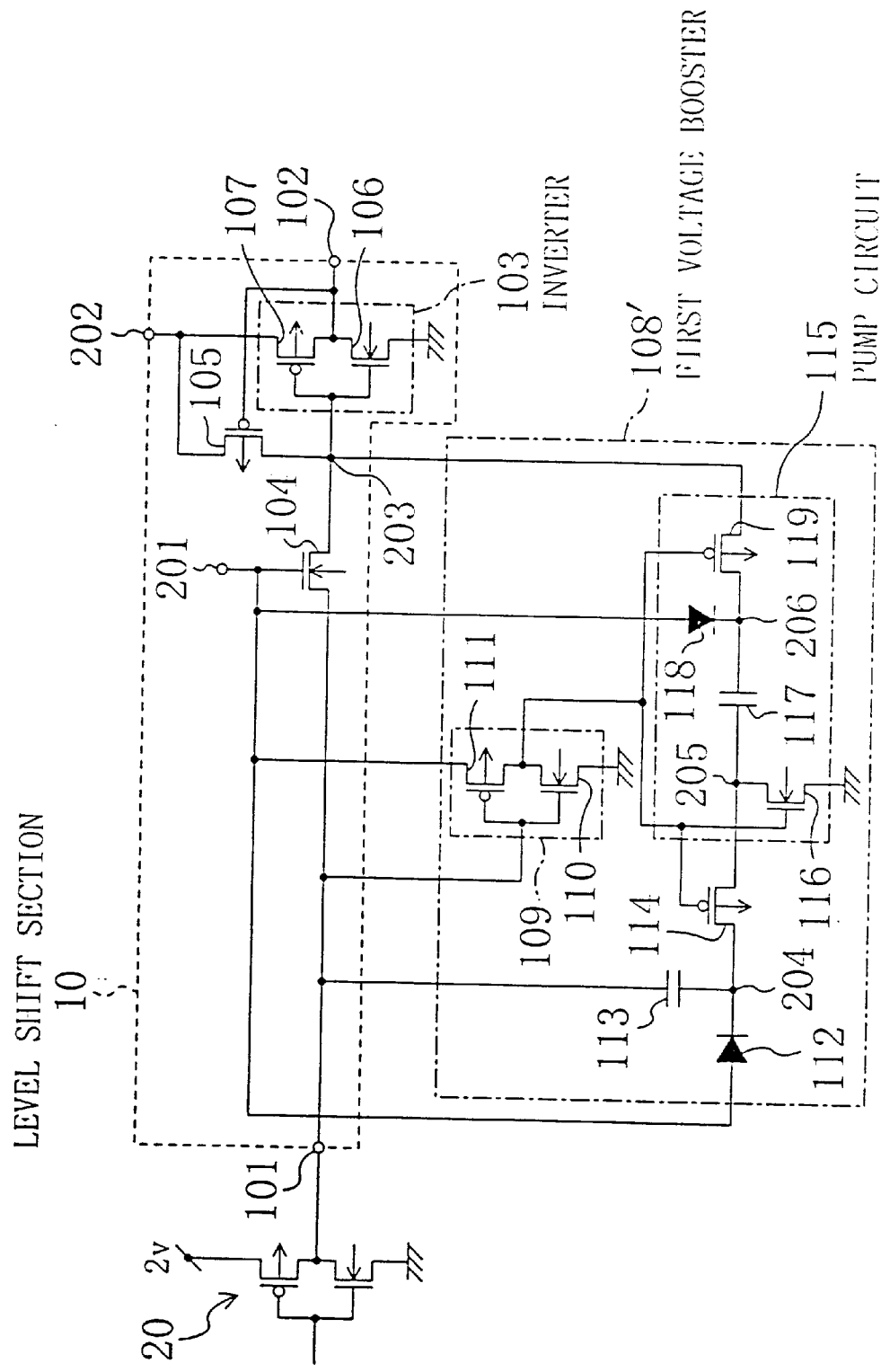
FIG. 3 is a circuit diagram showing a structure of a level shift circuit in accordance with a second embodiment of the present invention.

The level shift circuit of FIG. 3 has a voltage booster having a structure different from the voltage booster of FIG. 1 according to the first embodiment. In the voltage booster of the present embodiment, the Pch transistor 114 is disconnected from the intermediate node 203 and a pump circuit 115 for further increasing a boosted voltage level is provided at a stage posterior to the Pch transistor 114.

The pump circuit 115 has an NchMOS transistor 116 (a second NchMOS transistor). The NchMOS transistor 116 is connected between a ground power supply and the Pch transistor 114 and has a gate coupled to the output of the inverter 109. Reference numeral 205 designates an intermediate node between the Pch transistor 114 and the Nch transistor 116. 118 designates a diode functional element (a second diode functional element). The diode functional element 118 has a positive electrode node which is coupled to the first power supply terminal 201. 117 designates a capacitor functional element (a second capacitor functional element). The capacitor functional element 117 is connected between the intermediate node 205 and a negative electrode node of the diode functional element 118. 206 designates an intermediate node between the diode functional element 118 and the capacitor functional element 117. 119 designates a PchMOS transistor (a third PchMOS transistor). The PchMOS transistor 119 is connected between the intermediate node 206 and the intermediate node 203 and has a gate which is coupled to the inverter's 109 output.

With regard to the remaining structure, the shift level circuit of the second embodiment and the one shown in FIG. 1 are the same. Accordingly, like reference numerals have been used to designate like components and the detailed description thereof will not be made.

The above-described level shift circuit of the present embodiment will now be described below by making reference to FIG. 3.

Firstly, a situation, in which a low level voltage (0 volt) is applied to the signal input terminal, is described as an initial state. The Nch transistor 116 is in the ON state, for its gate potential is made HIGH (2 volts) by the inverter 109. Because of this, one of terminals of the capacitor functional element 117 is made LOW, while the other terminal thereof has been charged, through the diode functional element 118, up to a level lower than the first power supply voltage level by a degree corresponding to a drop in the ON voltage of the diode functional element 118. The voltage, Vcl, which is charged to the capacitor functional element 117, is given by:

$$Vcl = VL - Von,$$

where VL is the voltage of the first power supply and Von is the ON voltage of the diode functional element 118. The Pch transistor 119 is in the OFF state, for its gate potential is made HIGH (2 volts) by the inverter 109. The operation of the other circuitry is the same as shown in the first embodiment of FIG. 1.

When the signal input terminal 101 changes in voltage level to HIGH, the inverter's 109 output is LOW. The Nch transistor 116 enters the OFF state and the Pch transistors 114 and 119 enter the ON state. Because of this, as in the first embodiment, the voltage of the intermediate node 205 is increased up to a voltage level of (2VL−Von). A voltage of (VL−Von) has been charged to the capacitor functional element 118. The voltage of the intermediate node 206 is increased up to a voltage level of (3VL−2Von) and the voltage of the intermediate node 203 in continuity with the intermediate node 206 is increased up to the same level. In this way, in accordance with the present embodiment, the voltage of the intermediate node 203 can be increased to a greater extent when compared to the first embodiment, which makes it possible to perform a level shift operation at a lower first power supply voltage level.

With regard to the signal input terminal 101 changing from HIGH to LOW, the same operations as previously described in the first embodiment of FIG. 1 are carried out in the present embodiment.

Third Embodiment

A third embodiment of the present invention will be described by making reference to a level shift circuit shown in FIG. 4.

Figure 4:
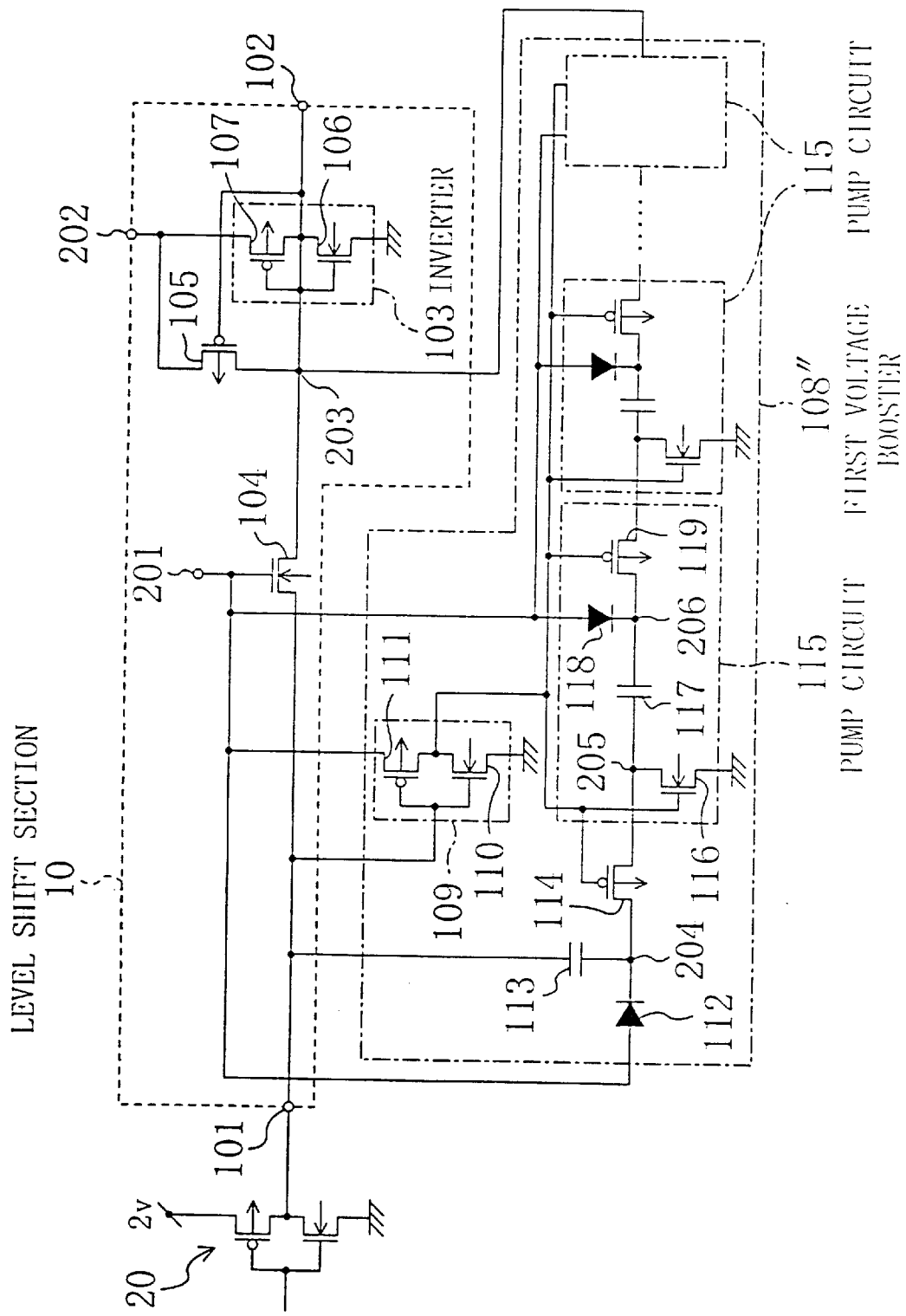
FIG. 4 is a circuit diagram showing a structure of a level shift circuit in accordance with a third embodiment of the present invention.

The level shift circuit of FIG. 4 has a voltage booster having a structure different from the voltage booster of FIG. 3 according to the second embodiment. In the present embodiment, the Pch transistor 114 is disconnected from the intermediate node 203, which is different from the first embodiment. The pump circuit 115 for further increasing a voltage boost level is provide plurally in number at respective stages posterior to the Pch transistor 114.

With regard to the remaining structure, the level shift circuit of the present embodiment and the FIG. 3 level shift circuit are the same. In FIGS. 3 and 4, functionally-equivalent components have been assigned the same reference numerals and the detailed description thereof is not made here.

When the signal input terminal 101 changes in voltage level from LOW to HIGH, each of the pump circuits 115 operates in the same way that the pump circuit 115 of the second embodiment does. Accordingly, when the signal input terminal 101 makes a transition in voltage level from LOW to HIGH, the voltage of the intermediate node 203 is increased up to a voltage level of $[(2+n)VL-(1+n)Von]$, where n indicates the number of pump circuits 115 disposed. In accordance with the present embodiment, the voltage level of the intermediate node 203 is pulled up by increasing the number of pump circuits 115 disposed, which makes it possible to provide a greater operating margin to the level shift circuit.

Fourth Embodiment

Figure 5:
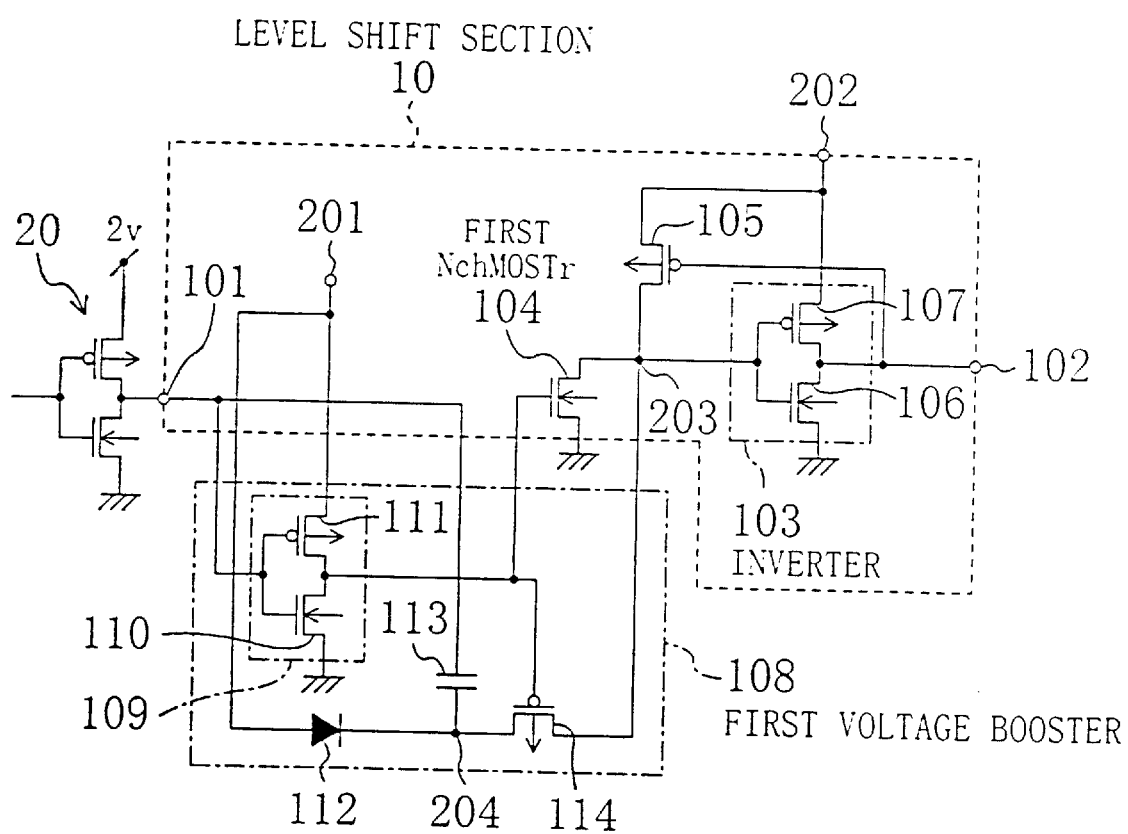
FIG. 5 is a circuit diagram showing a structure of a level shift circuit in accordance with a fourth embodiment of the present invention.

A fourth embodiment of the present invention is described by making reference to a level shift circuit shown in FIG. 5.

The level shift circuit of FIG. 5 has a structure that differs from that of the level shift circuit of the first embodiment of FIG. 1 in that the terminal of the Nch transistor 104, which is coupled to the signal input terminal 101 in the first embodiment, is no longer coupled thereto and connected with a ground power supply, and its gate is disconnected from the first power supply 201 and is coupled to the output of the inverter 109.

With regard to the remaining structure, the level shift circuit of the present embodiment and the FIG. 1 level shift circuit are the same. In FIGS. 1 and 5, functionally-equivalent components have been assigned the same reference numerals and the detailed description thereof is not made here.

Figure 6:
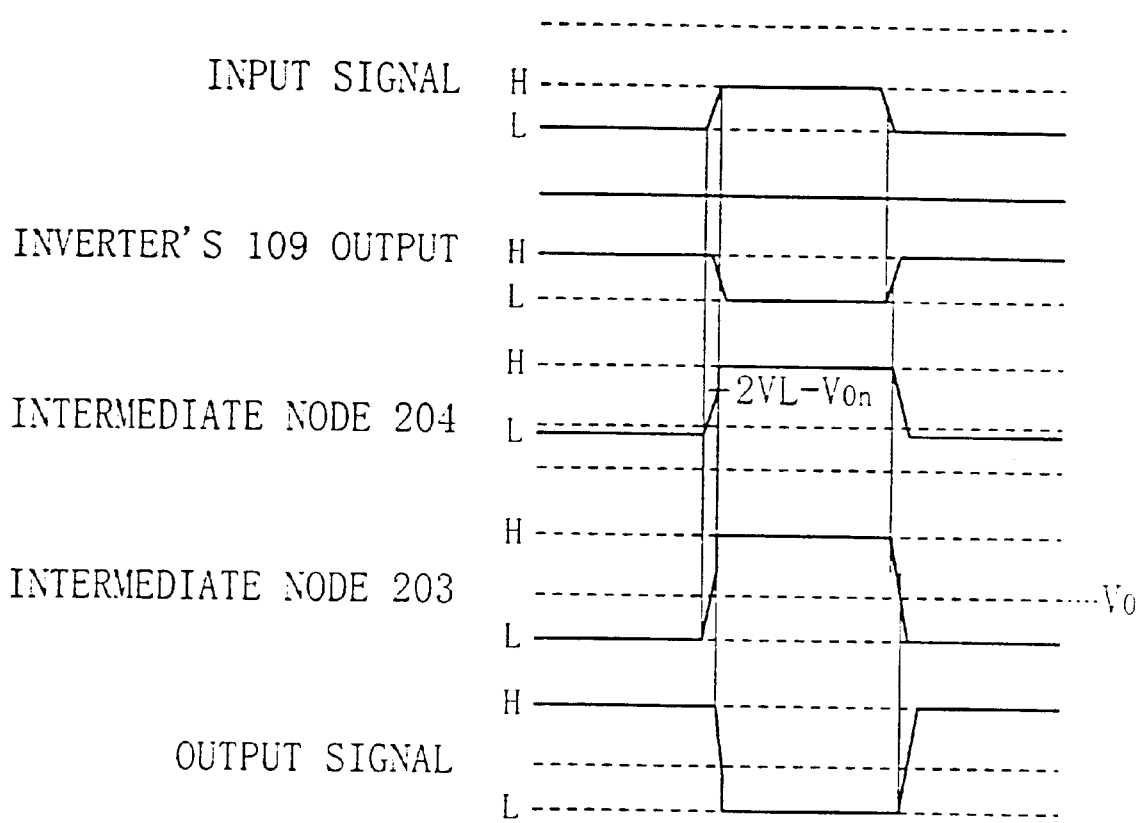
FIG. 6 is a timing chart diagram useful in understanding the operation of the fourth embodiment.

In the above-described level shift circuit, with regard to the signal input terminal 101 changing in voltage level from LOW to HIGH, the same operations as previously described in the first embodiment are carried out. Accordingly, a situation, in which the signal input terminal 101 makes a change in voltage level from HIGH to LOW, is described here with reference to FIG. 6.

When the voltage of the signal input terminal 101 is made LOW, the output of the inverter 109 is made HIGH (2 volts), and the Nch transistor 104 moves to the ON state. The potential of the intermediate node 203 continues to decrease from HIGH (i.e., the second power supply voltage level (5 volts)) towards LOW (0 volts). The Pch transistor 105 is in the ON state. Since one terminal of the Nch transistor 104 is coupled directly to ground, the potential level of the intermediate node 203 is determined by the magnitude of the ON resistance of the Nch transistor 104 with respect to the ON resistance of the Pch transistor 105 and is unaffected by the resistance value of the low voltage (2 volts) external circuit 20. That is, as the ON resistance of the Pch transistor 105 relatively increases, the potential level of the intermediate node 203 decreases. Accordingly, if the ON resistance of the Pch transistor 105 is set sufficiently greater than that of the Nch transistor 104, the potential of the intermediate node 203 will fall below Vo (the inverter's 103 switching voltage) and the output signal terminal 102 increases in voltage level from LOW (0 volt) towards HIGH (5 volts) by signal inversion.

Because of such signal inversion, the gate potential of the Pch transistor 105 continues to increase, and the ON resistance further increases. As a result, the potential of the intermediate node 203 is decreased to a lower value, and the voltage level of the output signal terminal increases. Finally, the Pch transistor 105 enters the OFF state. The potential of the intermediate node 203 arrives at LOW (0 volt), while the output signal terminal arrives at HIGH (5 volts). Also in this case, there exists no current path from the high voltage power supply to the low voltage power supply, which makes it possible to perform a voltage level shifting operation in the steady state with direct currents cut off.

The foregoing description shows that in accordance with the present embodiment, the level of voltage, to which the potential of the intermediate node 203 can be reduced, is determined by only the ON resistance of the Nch transistor 104 with no effect by the ON resistance of the external circuit 20, while in a prior art level shift circuit, the voltage level is determined by the value of a sum of the ON resistance of the Nch transistor 304 and the ON resistance of the external circuit 20 for driving the signal input terminal 301 with respect to the ON resistance of the Pch transistor 305. Accordingly, it is possible to provide a greater operating margin to the inverter 103 by reducing the voltage of the intermediate node 203 to a lower level. Additionally, it is possible to reduce the gate potential of the Nch transistor 104 by an amount corresponding to such an increased operating margin, thereby making it possible to perform a desired level shift operation at a lower first power supply voltage level.

Fifth Embodiment

Figure 7:
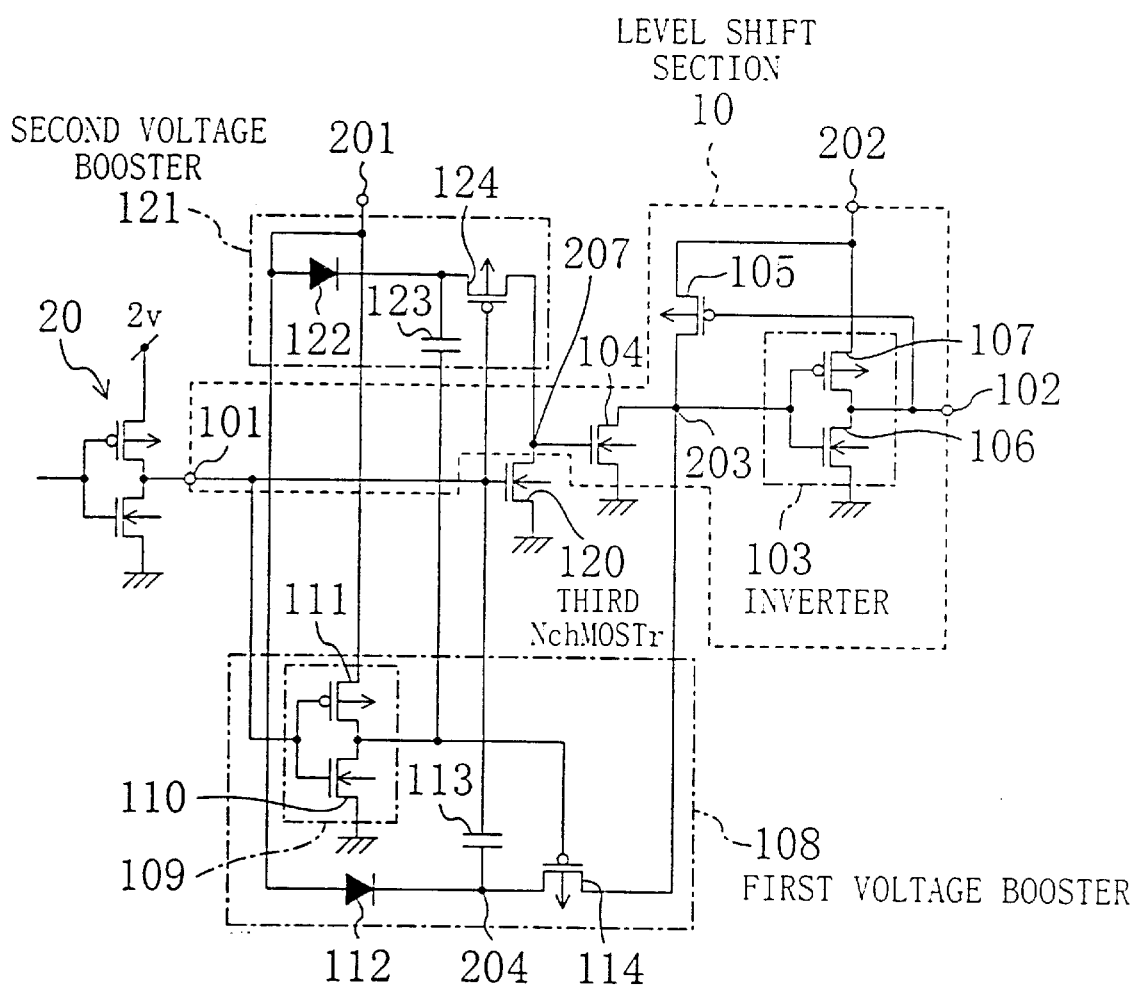
FIG. 7 is a circuit diagram showing a structure of a level shift circuit in accordance with a fifth embodiment of the present invention.

A fifth embodiment of the present invention is now described with reference to a level shift circuit shown in FIG. 7.

The present embodiment provides a level shift circuit which differs in configuration from the level shift circuit of FIG. 5 (the fourth embodiment) in that the level shift circuit of the present embodiment is provided with a new circuit. Reference numeral 120 designates an NchMOS transistor (a third NchMOS transistor). The Nch transistor 120 is connected between the gate of the Nch transistor 104 gate and a ground power supply and has a gate which is coupled to the signal input terminal 101. Note that the Nch transistor's 104 gate is disconnected from the inverter's 109 output. 207 designates an intermediate node between the two Nch transistors 104 and 120.

121 designates a voltage booster (a second voltage booster). The voltage booster 121, which is identical in internal configuration with the voltage booster 108, is made up of a diode functional element 122 (a third diode functional element), a capacitor functional element 123 (a third capacitor functional element), and a PchMOS transistor 124 (a fourth PchMOS transistor). The voltage booster 121 differs from the voltage booster 108 in that one terminal of the capacitor functional element 123 is coupled to the inverter 109 and a gate of the Pch transistor 124 is coupled to the signal input terminal 101. The voltage booster 121 has an output which is coupled to the intermediate node 207.

With regard to the remaining structure, the level shift circuit of the present embodiment and the FIG. 5 level shift circuit are the same. In FIGS. 5 and 7, functionally-equivalent components have been assigned the same reference numerals and the detailed description thereof is not made here.

The operation of the above-described level shift circuit is described with reference to FIG. 7.

When the signal input terminal changes in voltage level from LOW (0 volt) to HIGH (2 volts), the potential of the intermediate node 203 is pulled up by the voltage booster 108 as in the first embodiment and the signal output terminal 102 outputs a LOW level (0 volt) signal by signal inversion by the inverter 103. At this time, the Pch transistor 124 turns off, the Nch transistor 120 turns on, and the Nch transistor 104 turns off because its gate is LOW.

Within the voltage booster 121, since one of the terminals of the capacitor functional element 123 is at the same LOW level as the output of the inverter 109, the voltage (VL−Von) has been charged thereto through the diode functional element 122, as in the FIG. 1 embodiment.

When the signal input terminal 101 changes in voltage level from HIGH. (2 bolts) to LOW (0 bolt), the Nch transistor 120 turns off, the Pch transistor 124 turns on, and the Nch transistor 104 is boosted in gate potential up to a voltage level of (2VL−Von) by the voltage booster 121. Because of this, the ON resistance of the Nch transistor 104 is pulled down to a lower value when compared to the FIG. 5 embodiment. The voltage of the intermediate node 203 is reduced to a lower value, which makes it possible to allow a sufficient operating margin for HIGH level (5 volts) output from the inverter 103. Additionally, by virtue of such an operating margin, it becomes possible to perform a desired level shift operation at a lower first power supply voltage level.

Sixth Embodiment

Figure 8:
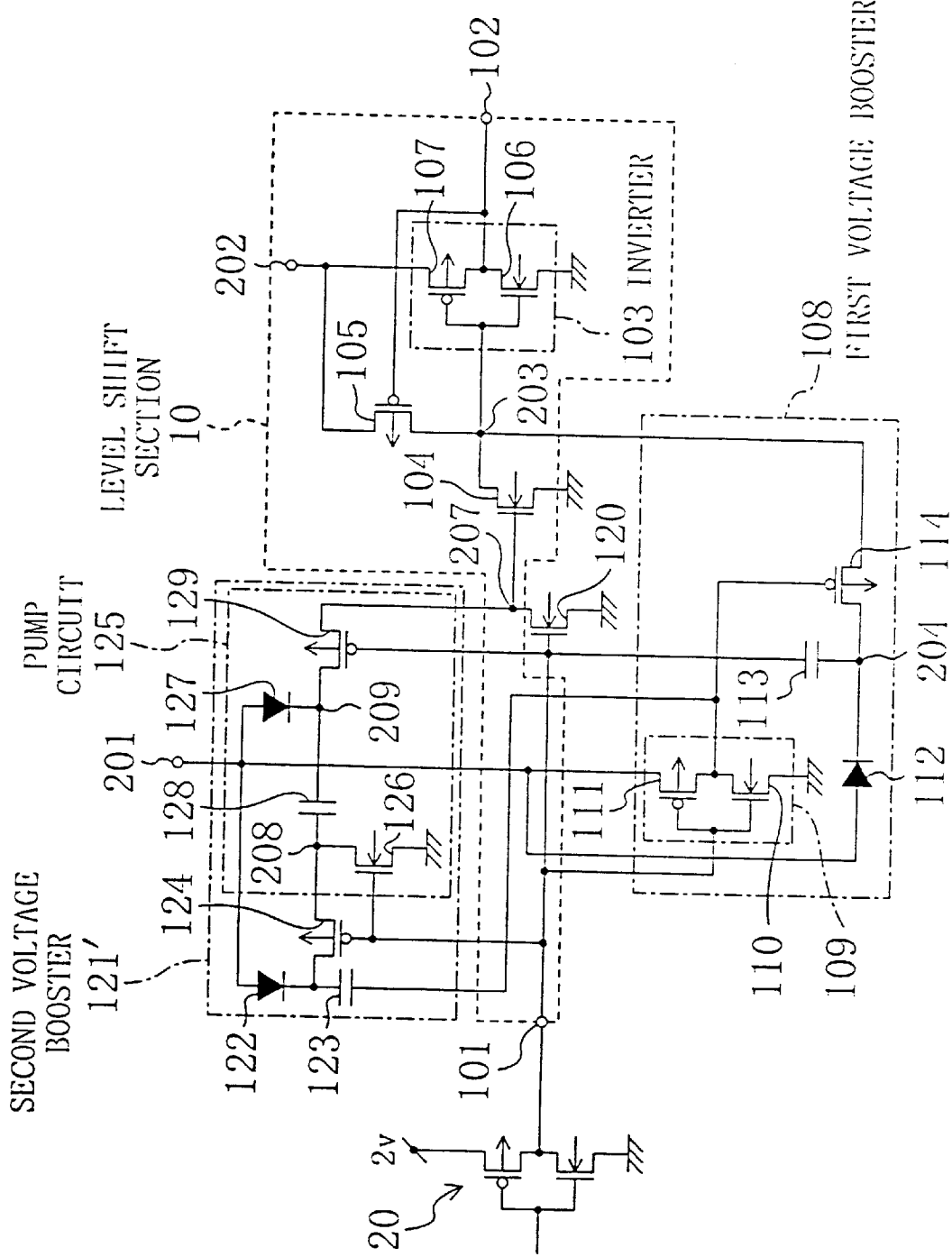
FIG. 8 is a circuit diagram showing a structure of a level shift circuit in accordance with a sixth embodiment of the present invention.

FIG. 8 shows a sixth embodiment of the present invention. A level shift circuit shown in FIG. 8 differs from the FIG. 7 level shift circuit (the fifth embodiment) in that it employs a voltage booster 121' which contains therein a pump circuit 125. This built-in pump circuit 125 is disposed to further increase a voltage level already boosted in the voltage booster and is identical in internal structure with the FIG. 3 pump circuit 115 (the second embodiment). The pump circuit 125 has an NchMOS transistor 126 (a fourth NchMOS transistor), a diode functional element 127 (a fourth diode functional element), a capacitor functional element 128 (a fourth capacitor functional element), and a PchMOS transistor 129 (a fifth PchMOS transistor).

As a result of such arrangement, in the present embodiment, it is possible to further increase the voltage of the intermediate node 207 to a higher level when compared to the fifth embodiment and even when the voltage of the first power supply is at a lower level, it is possible to secure execution of a level shift operation as desired.

Seventh Embodiment

Figure 9:
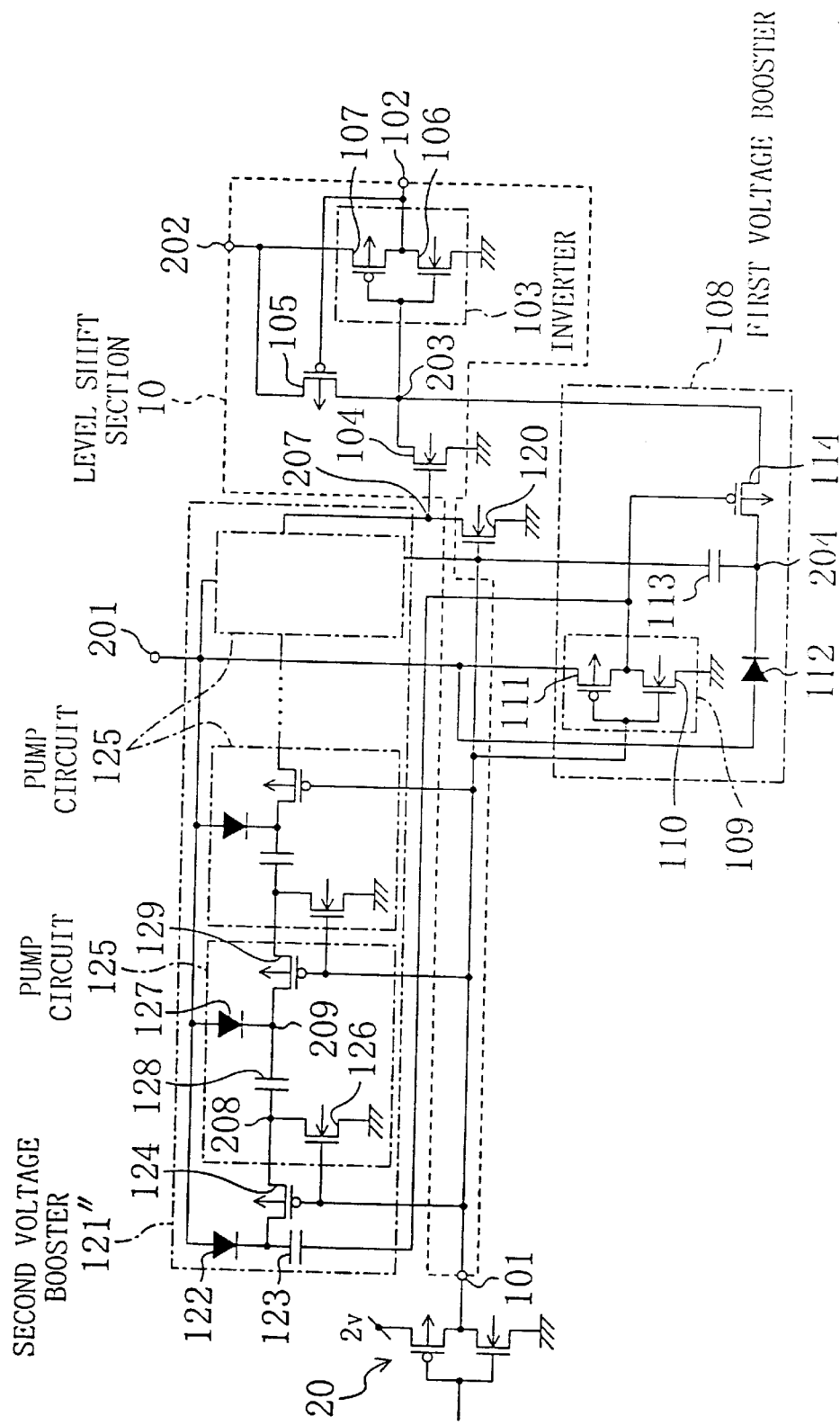
FIG. 9 is a circuit diagram showing a structure of a level shift circuit in accordance with a seventh embodiment of the present invention.
Figure 10:
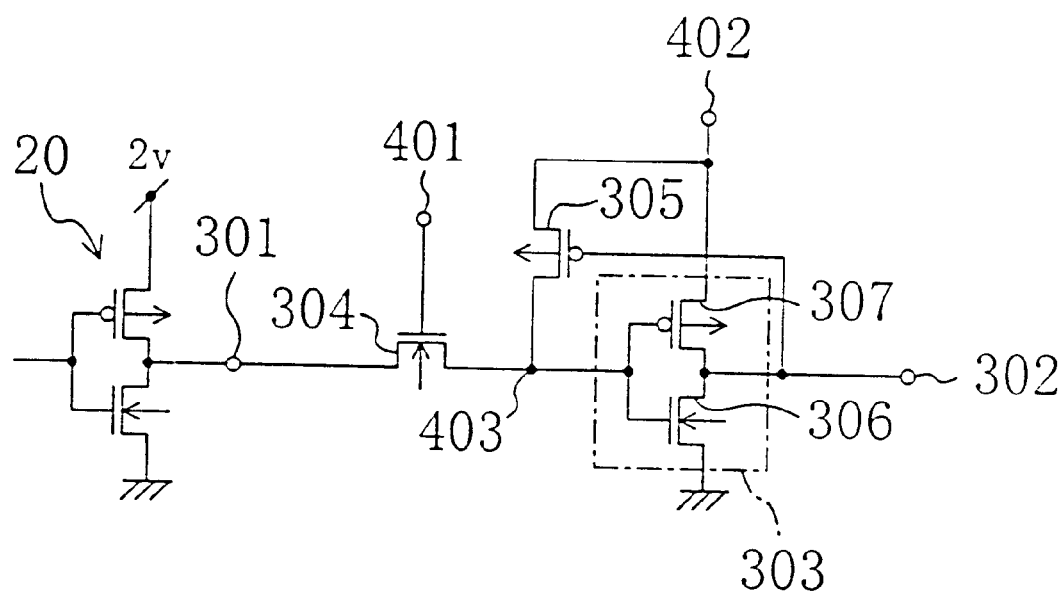
FIG. 10 is a circuit diagram showing a structure of a conventional level shift circuit.
Figure 11A:
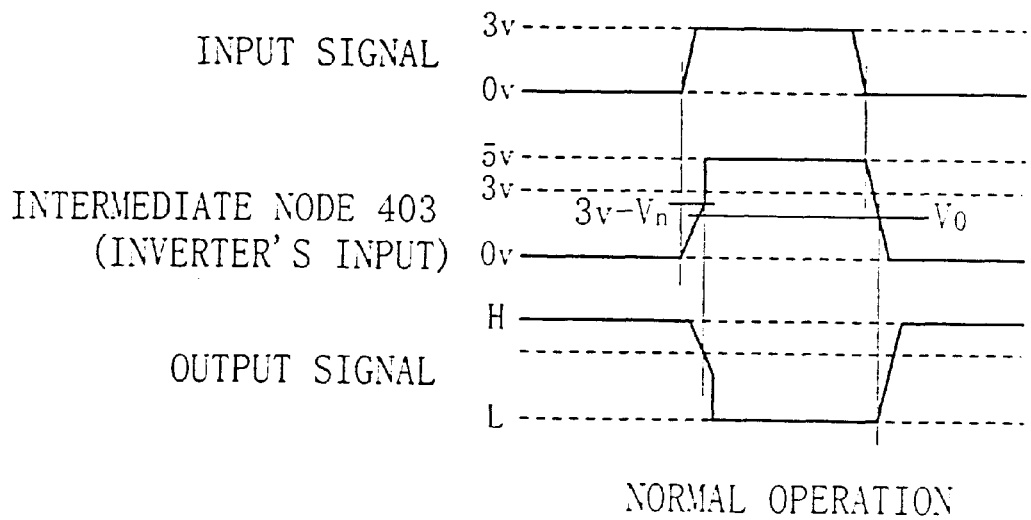
FIG. 11($a$) is a timing chart diagram for describing the normal operation of the conventional level shift circuit, while FIG. 11($b$) is a timing chart diagram for describing the malfunction of the conventional level shift circuit.
Figure 11B:
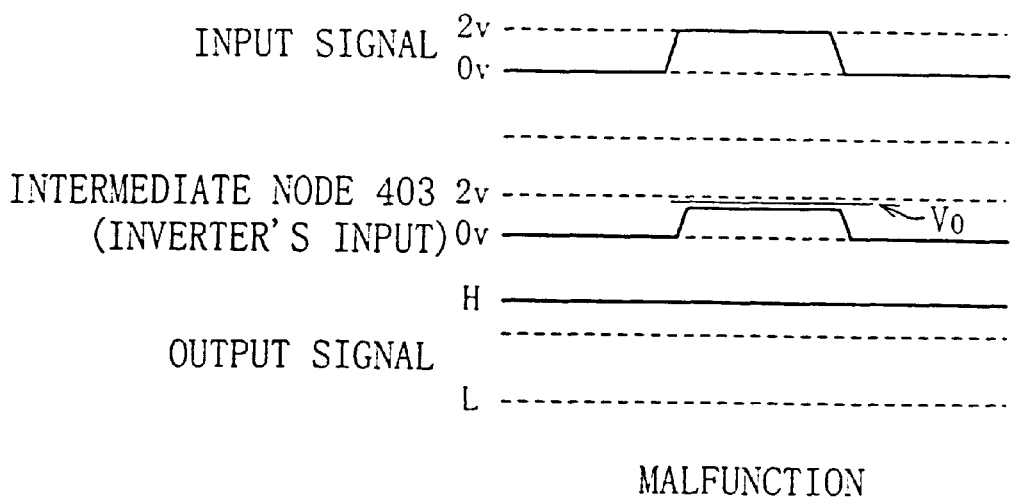

Referring to FIG. 9, there is shown a seventh embodiment of the present invention. In FIG. 9, there are provided a plurality of pump circuits 125 of FIG. 8 (the sixth embodiment) in series in a voltage booster 121", to repeatedly increase the level of voltage. The remaining other structure of the level shift circuit of the present embodiment is the same as shown in the FIG. 8 level shift circuit of the sixth embodiment. In FIGS. 8 and 9, the same components have been assigned the same reference numerals and the detailed description thereof is not made here.

In the present embodiment, when a signal applied at the signal input terminal 101 changes in voltage level from LOW to HIGH, it is possible to pull up the voltage of the intermediate node 207 to a higher level when compared to the sixth embodiment and even when the voltage of the first power supply is at a much lower level, it is possible to secure execution of a level shift operation as desired.

Eighth Embodiment

Figure 12:
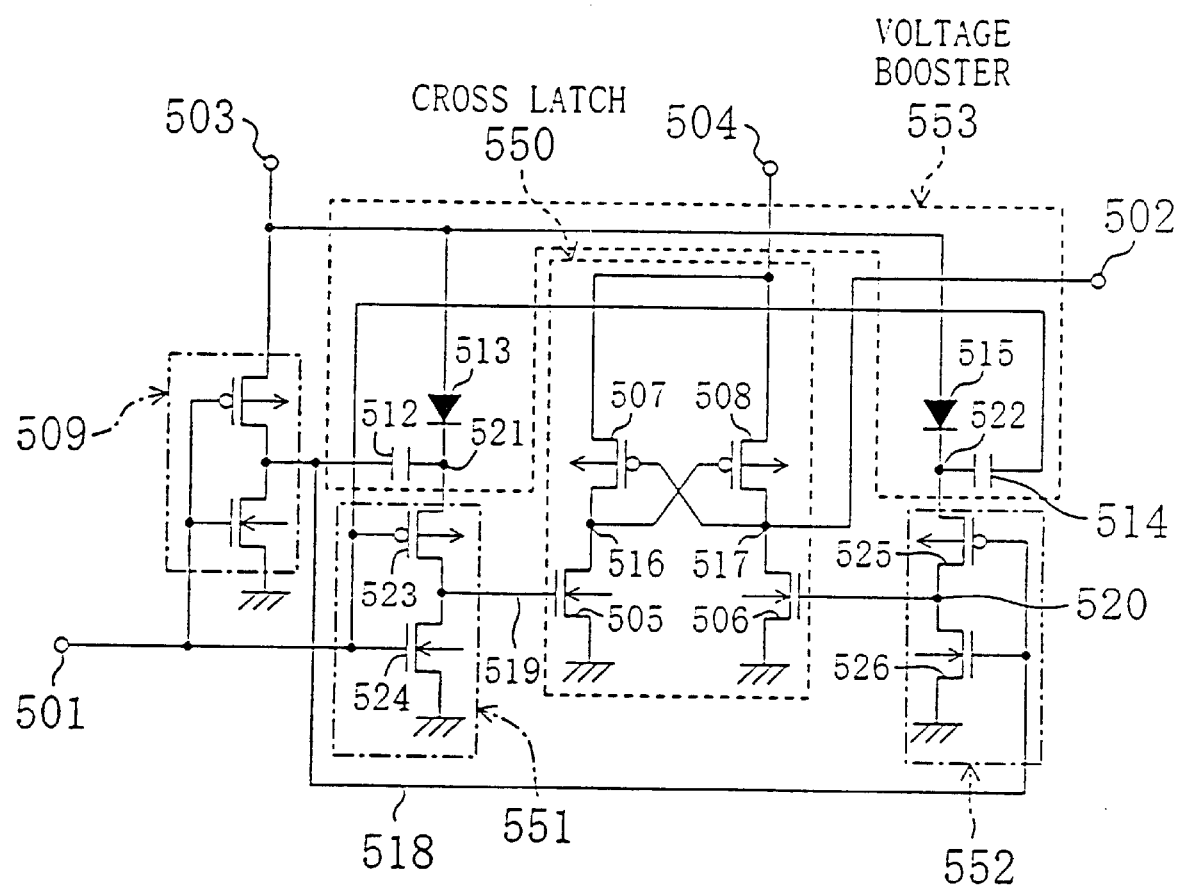
FIG. 12 is a circuit diagram showing a structure of a level shift circuit in accordance with an eighth embodiment of the present invention.
Figure 13:
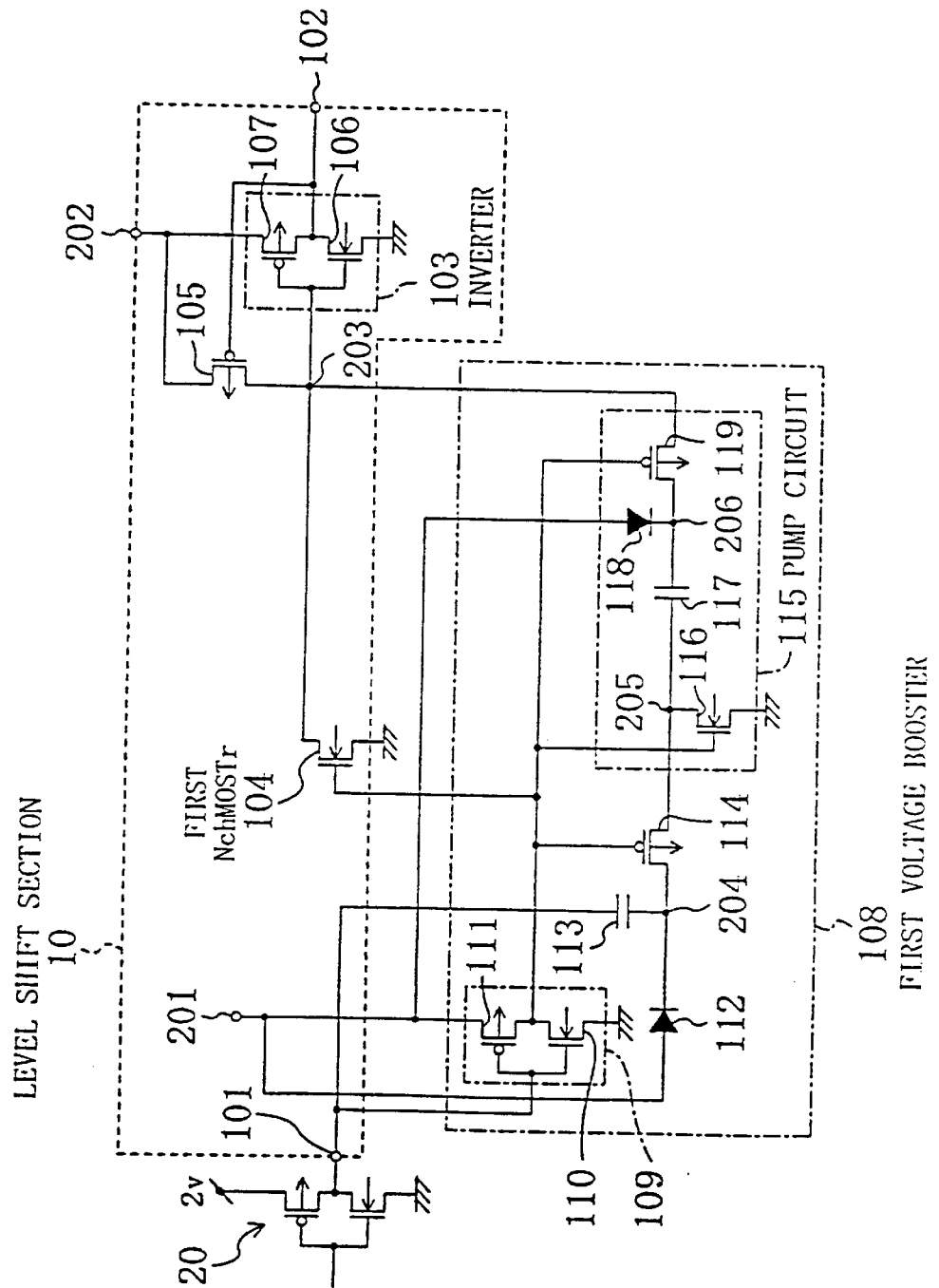
FIGS. 13 and 14 illustrate additional embodiments of the invention.
Figure 14:
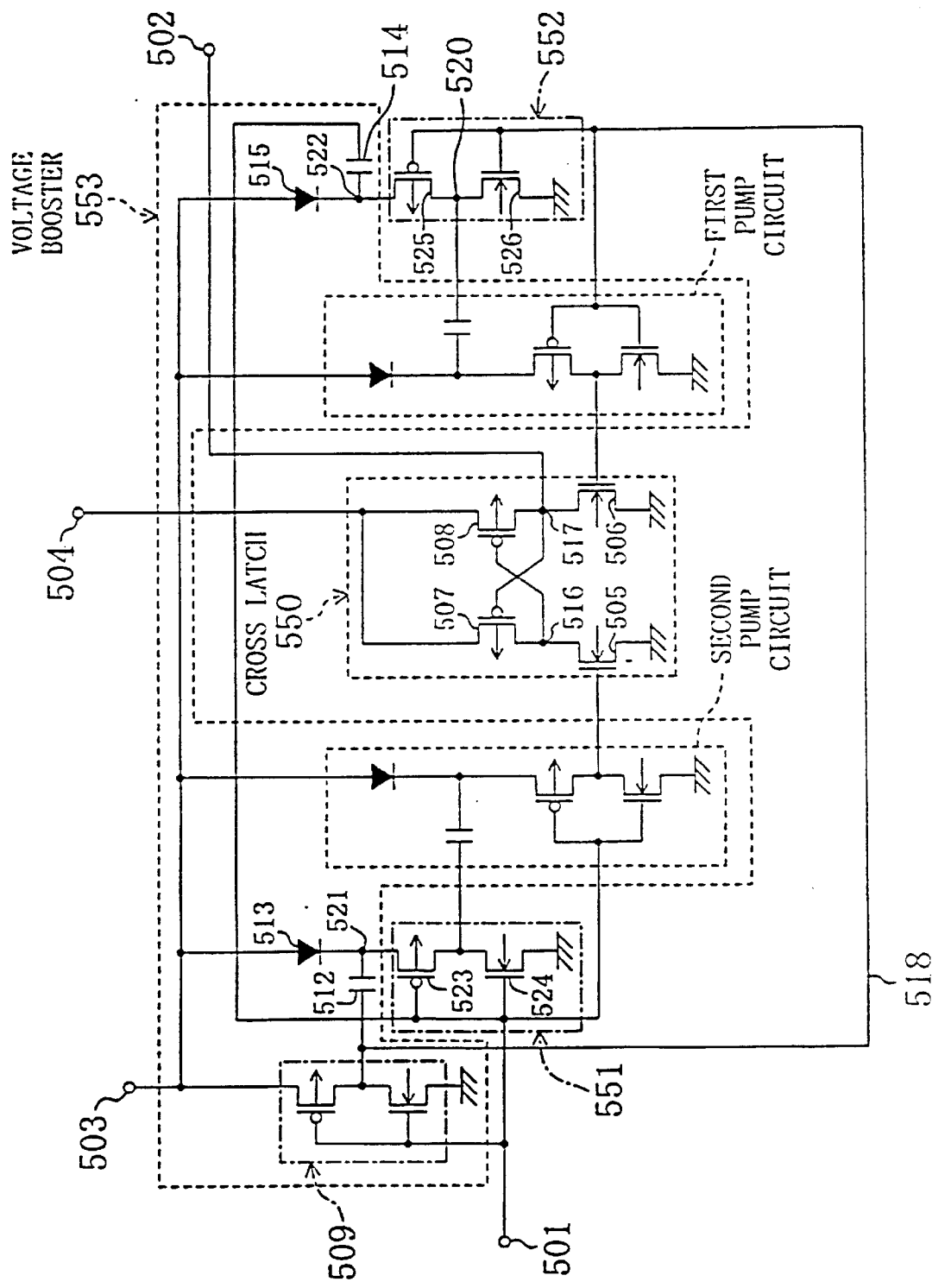

Referring to FIG. 12, there is shown an eighth embodiment of the present invention. FIG. 12 shows an example application of the eighth embodiment to a differential level shift circuit.

In FIG. 12, reference numeral 550 designates a cross latch circuit. 501 designates a signal input terminal at which a signal to the cross latch circuit 550 is input. 502 designates a signal output terminal at which an output signal from the cross latch circuit 550 is provided. 509, 551, and 552 are inverters. The inverter 551 inverts an input signal applied at the signal input terminal 501 and provides a negative phase signal with the input signal to the cross latch circuit 550. The inverter 509 inverts the input signal applied at the signal input terminal 501. The inverter 552 inverts the inverted input signal (i.e., the input signal inverted in the inverter 509) and provides a signal in phase with the input signal originally applied at the signal input terminal 501 to the cross latch circuit 550. The cross latch circuit 550 and the two inverters 551 and 552 together form a level shift section.

Reference numeral 553 designates a voltage booster (a first voltage circuit). The voltage booster 553 has the inverter 509, two diode functional elements 513 and 515, and two capacitor functional elements 512 and 514. One terminal of the diode functional element 513 is coupled to a first power supply terminal 503. One terminal of the diode functional element 515 is coupled to the first power supply terminal 503. The capacitor functional element 514 (a first capacitor functional element) has terminals of which one is fed a signal in phase with the input signal applied at the signal input terminal 501 and the other is coupled to the diode functional element 515 (a first diode functional element). The capacitor functional element 512 (a second capacitor functional element) has terminals of which one is fed a signal inverted by the inverter 509 which is a negative phase signal with the input signal applied at the signal input terminal 501 and the other is coupled to the diode functional element 513 (a second diode functional element). The voltage at a node where the diode functional element 515 and the capacitor functional element 514 are connected is applied, by way of a PchMOS transistor 525, to the gate terminal of an NchMOS transistor 506 of the cross latch circuit 550. On the other hand, the voltage at a node where the diode functional element 513 and the capacitor functional element 512 are connected is applied, by way of a PchMOS transistor 523, to the gate terminal of an NchMOS transistor 505 of the cross latch circuit 550.

The operation of the present embodiment is now described. A situation, in which a signal which changes in voltage level from LOW to HIGH is input to the signal input terminal 501, is described below.

Firstly, when the input signal level is LOW, the intermediate node 518 is made HIGH by the inverter 509. The intermediate node 521 is also HIGH, but it is higher than the intermediate node 518 by a voltage amount charged by the diode 513 into the capacitor functional element 512. The P-channel transistor 523 is in the ON state and an intermediate node 519 assumes the same HIGH level. An N-channel transistor 526 is in the ON state. An intermediate node 520 is LOW. A P-channel transistor 525 is in the OFF state. One of the terminals of the capacitor functional element 514 is coupled to the signal input terminal 501, so that the capacitor functional element 514 is charged, through the diode functional element 515, by the first power supply terminal 503 which has the voltage VL (for example, 2 volts), up to a voltage level of (VL−Von), where Von is the ON voltage of the diode functional element 515.

At this time, since the intermediate node 519 is HIGH, the N-channel transistor 505 is in the ON state and an intermediate node 516 is LOW. A P-channel transistor 508 is in the ON state, for the intermediate node 516 is LOW. On the other hand, since the intermediate node 520 is LOW, the N-channel transistor 506 is in the OFF state. As a result, an intermediate node 517 is HIGH and a P-channel transistor 507 is in the OFF state. The degree of HIGH of the intermediate node 517 is pulled up to the voltage level (VH) of the second power supply 504 (for example, 5 volts) and this boosted voltage is provided to the signal output terminal 502.

When the signal input terminal 501 changes from such a state to HIGH (2 volts), an N-channel transistor 524 changes to the ON state and the P-channel transistor 523 changes to the OFF state, and the intermediate node 519 is made LOW. The intermediate node 518 is made LOW. The capacitor functional element 512 is charged by the first power supply terminal 503 through the diode functional element 513 and the intermediate node 521 assumes a voltage level of (VL−Von). This voltage level is identical with that of the intermediate node 522 when the signal input terminal 510 is LOW. On the other hand, the N-channel transistor 526 changes to the OFF state and the P-channel transistor 525 turns on. However, at this time, the signal input terminal 501 changes to HIGH, as a result of which the intermediate node 522 is voltage increased by the capacitor functional element 514 for an amount of VL to have a voltage level of (2VL−Von). The intermediate node 520 assumes the same voltage level. The intermediate node 519 changes to LOW and the intermediate node 520 changes to HIGH, so that the N-channel transistor 505 changes to the OFF state and the N-channel transistor 506 changes to the ON state. The turning on of the N-channel transistor 506 causes the intermediate node 517 to make a transition from HIGH to LOW, and the gate potential of the P-channel transistor 507 gradually decreases to change to the ON state, thereby pulling up the potential level of the intermediate node 516. On the other hand, the gate potential of the P-channel transistor 508 gradually increases to change to the OFF state, thereby further accelerating the intermediate node 517 to fall in potential level. Such a series of operations accelerates the transistors 507 and 508 and the nodes 516 and 517 to vary in state. As a result, the intermediate node 516 finally arrives at VH (the voltage level of the second power supply terminal 504), the intermediate node 517 arrives at LOW, and the signal output terminal 502 becomes LOW. At this time, the path extending from the second power supply terminal 504 to ground is in a cutoff state because both the N-channel transistor 505 and the P-channel transistor 508 are in the OFF state. This makes it possible to perform, in the steady state, a voltage level shifting operation with direct currents cut off.

In the foregoing description, the situation that the signal input terminal 501 makes a transition from LOW to HIGH is explained. In the opposite situation (that is, when the signal input terminal 501 changes from HIGH to LOW), the same operations as in the former situation are carried out except that the operations of the circuits in symmetry are switched. Accordingly, these operations will not be described.

Here, a situation, in which the signal input terminal 501 changes from LOW to HIGH, is considered. In such a situation, when the intermediate node 520 changes to HIGH to cause the N-channel transistor 506 to turn on, the pull-down level of how much the intermediate node 517 is to be decreased in voltage level is determined by a ratio of the ON resistance of the N-channel transistor 506 and the ON resistance of the P-channel transistor 508 which is in the ON state. If the level of the intermediate node 517 fails to decrease from VH (the voltage level of the second power supply terminal 504) beyond Vt (the threshold voltage of the P-channel transistor 507), this will prevent the P-channel transistor 507 from turning on. As a result, a considerably long period of time will be taken for performing an output inversion operation.

In conventional circuits, the source-gate voltage of the P-channel transistor 508 is VH, while the gate-source voltage of the N-channel transistor 506 is VL. Accordingly, as the first power supply voltage VL decreases to fall below the second power supply voltage VH (in other words, as the voltage VL is decreased), the ON resistance of the N-channel transistor 506 increases. This makes it hard for the intermediate node 517 to decrease in voltage level. Since the MOS transistor saturation current is approximately proportional to $(Vg-Vt)^2$ (in the present circuit, Vg=VL), the N-channel transistor 506 undergoes an abrupt drop in its performance when the voltage VL approaches the threshold voltage Vt of the N-channel transistor 506. Accordingly, the N-channel transistor 506 has difficulties in operating. What is required to pull down the level of the intermediate node 517 is to increase the transistor size of the N-channel transistor 506 as large as possible. However, if the voltage VL has a value in the vicinity of the threshold voltage Vt, the N-channel transistor 506 is required to be very large in size. In accordance with the present embodiment, since the intermediate node 520 is pulled up by the voltage booster 553 above the first power supply voltage VL, thereby ensuring the operation of the N-channel transistor 506.

As in the second and third embodiments, one or more pump circuits may be added to the differential level shift circuit of the present embodiment (not shown).

What is claimed is:

1. A level shift circuit comprising:
   a voltage booster which is operated by a first supply voltage defining a first power supply, receives a first signal having a voltage level of said first supply voltage, said voltage booster, responsive to said first signal transitioning from a LOW to a HIGH level, outputs a second signal having a voltage level above the voltage level of said first supply voltage; and
   a level shift section which is operated by a second supply voltage defining a second power supply having a voltage level above the voltage level of said first supply voltage, receives and inverts said second signal to generate an inverted signal, and shifts a voltage level of said inverted signal to the same level as the voltage level of said second supply voltage.

2. A level shift circuit comprising:
   a voltage booster which is operated by a first supply voltage defining a first power supply, receives an in-phase signal which is equal in phase to a first signal having a voltage level of said first supply voltage and a negative phase signal which is opposite in phase to said first signal, and outputs a second in-phase signal which is equal in phase to a second signal having a voltage level above the voltage level of said first supply voltage and a second negative phase signal which is opposite in phase to said second signal having a voltage level above the voltage level of said first supply voltage, corresponding with timing of said first signal transitioning from a LOW to a HIGH level; and
   a level shift section which is operated by a second supply voltage defining a second power supply having a voltage level above the voltage level of said first supply voltage, receives and inverts said second in-phase signal and said second negative phase signal to generate inverted signals and shifts each voltage level of said inverted signals to the same level as the voltage level of said second supply voltage.

* * * * *